United States Patent [19]
Kermani

[11] Patent Number: 6,088,254
[45] Date of Patent: Jul. 11, 2000

[54] UNIFORM MESH CLOCK DISTRIBUTION SYSTEM

[75] Inventor: Bahram Ghaffarzadeh Kermani, Whitehall, Pa.

[73] Assignee: Lucent Technologies Inc., Murray Hill, N.J.

[21] Appl. No.: 09/249,572

[22] Filed: Feb. 12, 1999

[51] Int. Cl.⁷ .................................................. G11C 5/06
[52] U.S. Cl. ............................. 365/63; 365/233; 365/149
[58] Field of Search ............................. 365/63, 233, 148, 365/149

[56] References Cited

U.S. PATENT DOCUMENTS

| | | | |
|---|---|---|---|
| 5,812,490 | 9/1998 | Tsukude | 365/63 |
| 6,002,638 | 12/1999 | John | 365/233 |
| 6,018,492 | 1/2000 | Sugibayashi | 365/63 |

*Primary Examiner*—Richard Elms
*Assistant Examiner*—Tuan T. Nguyen
*Attorney, Agent, or Firm*—Mark A. Kurisko

[57] ABSTRACT

A mesh clock distribution system for reducing errors in synchronous systems caused by clock skew. The mesh clock distribution apparatus includes a mesh and a set of delivery conductors coupling a clock source to the mesh. Tile mesh is formed of a set of signal paths that interconnect at a set of nodes, wherein at least three of the interconnecting signal paths form the sides of a closed equilateral polygon. The set of delivery conductors transmit the clock signal to the nodes and the nodes distribute the clock signal along the length of the signal paths. Clocked elements in the synchronous system are connected to the signal paths and receive the clock signal from the signal paths.

17 Claims, 6 Drawing Sheets

UNIFORM MESH CLOCK DISTRIBUTION SYSTEM

FIELD OF THE INVENTION

This invention relates to improved apparatus and methods for distributing clock signals in synchronous systems. Particularly, the invention concerns apparatus and methods for reducing errors in synchronous systems caused by clock skew.

BACKGROUND OF THE INVENTION

Typically, a clock source outputs a clock signal that synchronizes the activities in large synchronous systems, such as memory arrays. The clock signal acts as both a sequence reference and as a time reference for events within the synchronous system. As a sequence reference, the clock transitions define successive instants at which system state changes occur. As a time reference, the time period between clock transitions accounts for system delays occurring between the output of the clock source and the input to a selected clocked element in the synchronous system.

Differences in the arrival of the clock signal at two or more clocked elements can result in errors in the synchronous system. Clock skew is defined as the time delay between generation of the clock signal at a clock source and arrival of the clock signal at a selected clocked element. Differences in clock skew between the clock source and different clocked elements can create errors in the synchronous system as the clocked elements are triggered at different points in time.

For example, the sum of the all the capacitance in the registers in a large CMOS device may exceed 100 pF. Driving this level of capacitance in a small time and at a high frequency can create substantial clock skew. In addition, the clock skew typically changes as the path length between the clock source and the selected clocked element varies and as the capacitance and/or resistance of the conductive path between the clock source and the clocked element varies. Thus, one clocked element having a first path length from the clock source and a second clocked element having a second path length from the clock source are subject to different clock skews. These variations in clock skew at the clocked elements of the synchronous system create inaccuracies in system synchronization.

Two main techniques are known for combating errors caused by clock skew: the use of a single large buffer for driving the clock signal, and the use of a distributed clock-tree. In the first approach, a single buffer is used to drive a global clock that feeds all elements in the synchronous system. This approach is preferred in designs having a large number of diverse modules that lack a structured routing approach. Clocked elements both near to the clock source and far from the clock source are driven by the same buffer. Accordingly, clocked elements near the clock source receive a clock signal having a different clock skew than clocked elements far from the clock source. These differences in clock skew can cause errors in synchronizing the clocked elements.

A second approach involves distributed clock trees having suitable geometry for transmitting the clock signal to the clocked elements in the synchronous system. Either the delay along each path of the clock tree can be carefully simulated and matched, although such simulations are typically inaccurate, or the distribution of the clock can be arranged so that any RC delay occurs in a safe skew direction. One distributed clock tree technique is an H-tree scheme for distributing the clock signal, as shown in FIG. 6. The illustrated H-tree scheme distributes the clock signal along branches in a tree wherein the leaves in the tree are the clocked elements of the synchronous system. H-tree schemes can be used to distribute the clock signal to regular arrays within a synchronous system such that every element in the synchronous system is the same distance from the clock generator. The H-tree scheme, however, suffers from other drawbacks. In particular, H-tree schemes have clock skews proportional to the size of the synchronous array considered, such that H-trees implemented with large synchronous arrays suffer from severe clock skew that can even extend beyond the time period of one clock cycle.

Accordingly, there is a need for a synchronous system that distributes a clock signal with reduced error caused by clock skew.

SUMMARY OF THE INVENTION

Reducing error caused by clock skew may be achieved, according to the invention, by distributing a clock signal to a plurality of nodes in a mesh distribution system. In one embodiment, according to the invention, the clock distribution apparatus includes a mesh and a plurality of delivery conductors operably coupling a clock source to selected nodes in the mesh. The mesh is formed of a plurality of signal paths that interconnect at a plurality of nodes. At least three of the interconnecting signal paths form the sides of a closed equilateral polygon. The nodes and the signal paths distribute the clock signal.

Another embodiment, according to the invention, provides for a method of distributing a clock signal. The method includes the steps of transmitting a clock signal and distributing the clock signal. The clock signal is transmitted along a plurality of delivery conductors operably coupled to a set of nodes in a mesh, wherein each node is formed at the intersection of at least two signal paths. After being transmitted, the clock signal is distributed from the set of nodes along the signal paths.

BRIEF DESCRIPTION OF THE DRAWINGS

The foregoing features and advantages of the invention will be apparent from the following description of preferred embodiments, as illustrated in the accompanying figures in which like reference characters refer to the same elements throughout the different views.

DETAILED DESCRIPTION

Figure 1:
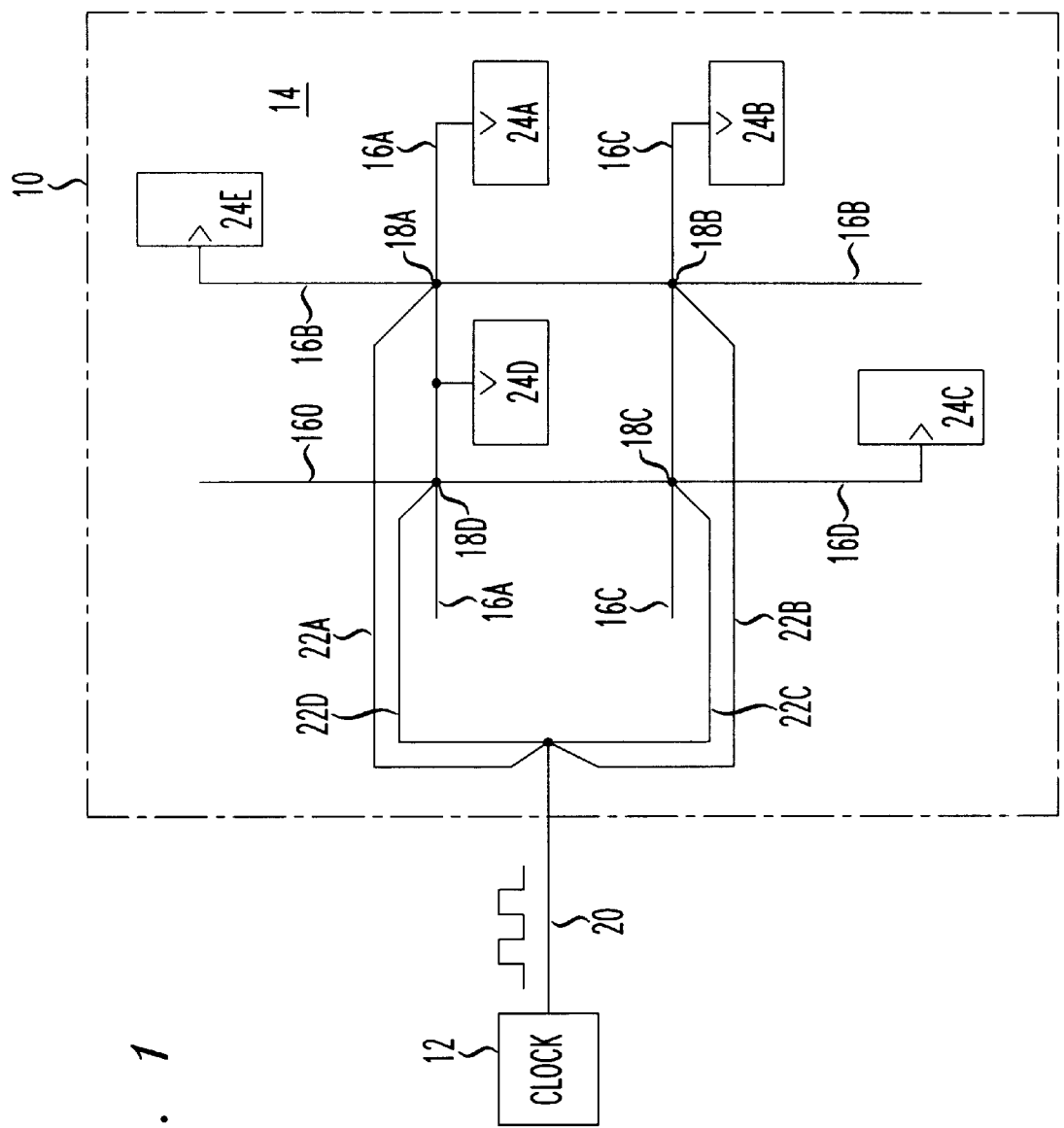
FIG. 1 is a schematic diagram of a uniform mesh clock distribution apparatus according to the invention.

FIG. 1 shows a clock distribution apparatus 10, according to the invention, for distributing a clock signal 20 generated at a clock source 12. The clock distribution apparatus 10 includes a mesh 14 formed of a plurality of signal paths 16A–16D and a plurality of nodes 18A–18D. The signal paths 16A–16D form the sides of a closed equilateral polygon in the mesh 14. A set of delivery conductors 22A–22D operably couple the clock source 12 to selected nodes in the mesh 14. In general, the clock distribution apparatus 10 can be used in any clocked synchronous system.

In operation, the clock source 12 generates the clock signal 20 that is transmitted to selected nodes of the mesh 14 by the conductors 22A–22D. The term "conductors" refers to any energy conductors, such as electrically conductive elements, optically conductive elements, and radio-frequency conductive elements. The clock signal 20 is then distributed from the selected nodes along the signal paths of the mesh 14.

The distribution apparatus 10 includes a mesh 14 formed of signal paths 16A, 16B, 16C and 16D. The distribution apparatus 10 also includes nodes 18A, 18B, 18C and 18D, each being formed at the intersection of two or more signal paths. As illustrated, signal path 16A extends through and beyond nodes 18A and 18D; signal path 16B extends through and beyond nodes 18A and 18B; signal path 16C extends through and beyond nodes 18B and 18C; and signal path 16D extends through and beyond nodes 18C and 18D. The signal paths 16A–16D are formed of conductors capable of distributing energy signals, and the nodes connect two or more signal paths in a manner that allows the energy signals to be distributed from one signal path to another via the node. For example, the signal paths can be electrically conductive paths and the nodes can be solder joints. The electrically conductive paths can be runs in a printed circuit board or etch lines in all integrated circuit. Alternatively, the signal paths call be optical fibers and the nodes can be optical couplings.

Within the mesh 14, at least three of the signal paths 16A–16D form a closed equilateral polygon for distributing the energy signal. An equilateral polygon is defined as a closed plane figure bounded by three or more equal length line segments. The line segments of the polygon are not limited to straight lines, for instance the line segments can be formed of arcs. In FIG. 1 signal paths 16A, 16B, 16C, and 16D form the sides of a square. The signal paths 16A–16D also extend beyond the edge of the closed polygonal shape. The polygonal shape of the signal paths provides for a structure that uniformly distributes energy signals applied at the nodes of the mesh 14.

As stated above, the signal paths can form closed polygon shapes having sides of substantially equal length. Polygons having sides of substantially equal length prove advantageous because they reduce the potential difference in time delay between the clock source and the clocked elements attached to the mesh. In the case where the signal paths form an equilateral polygon having sides of length L and where all nodes of the mesh are coupled to the clock source, the time delay of a clock signal distributed from a node in the mesh is limited to the time required for the clock signal to travel the length L. In addition, if the equilateral polygon does not include any extended signal paths, then the time delay of a clock signal distributed from a node is limited to the time required for the clock signal to travel the length L/2. By limiting the time delay, the maximum error in the synchronous system caused by clock skew is reduced.

Additional aspects provide for signal paths forming n-sided polygons, such as triangles, rectangles, pentagons, hexagons, etc. Further, it is not required that all polygons formed by the mesh have the same number of sides. For instance, some of the polygons in a mesh according to the invention can have four sides while others in the same mesh have three sides.

FIG. 1 further illustrates a set of delivery conductors 22A, 22B, 22C and 22D for operably coupling the clock source 12 with the mesh 14. The set of delivery conductors couple the clock Source with selected nodes in the mesh 14. For instance, in FIG. 1, the delivery conductors couple the clock source 12 with nodes 18A–18D.

A set of clocked elements 24A, 24B, 24C, 24D and 24E are operably coupled to the signal paths. The clocked elements form the operational elements of the synchronous system. For instance, the clocked elements can be memory devices which together form a memory array.

In operation, the clock source 12 generates a clock signal 20 that is transmitted to the mesh along delivery conductors 22A–22D. The mesh receives the clock signal 20 at the set of nodes connected to the delivery conductors, i.e. at nodes 18A–18D. The clock signal is then distributed from nodes 18A–18D along the signal paths 16A–16D to the clocked elements 24A–24E. The clock distribution system advantageously equalizes skew of the clock signal 20 at each of the clocked elements by uniformly distributing the clock signal 20 throughout the mesh 14.

For example, signal path 16A that passes through nodes 18A and 18D is theoretically a perfect conductor, but in reality signal path 16A has both resistance and parasitic capacitance. The resistance and capacitance in signal path 16A affects the transmission of a signal along the path from any of the nodes. A clock signal applied at node 18D and received at clocked element 24D, and later at clocked element 24A, suffers from an increasing time delay as the clock signal travels along signal path 16A. Accordingly, the skew at clocked elements 24A and 24D differs. By applying the clock signal to both nodes 18D and 18A the skew at the clocked element 24A and the skew at the clocked element 24D are brought closer to equality, thereby reducing the error in the synchronous system caused by clock skew. The mesh structure of the present invention advantageously distributes the clock signal throughout the synchronous system at multiple nodes, as compared to the prior art systems that distribute the clock signal from a single node.

Figure 2:
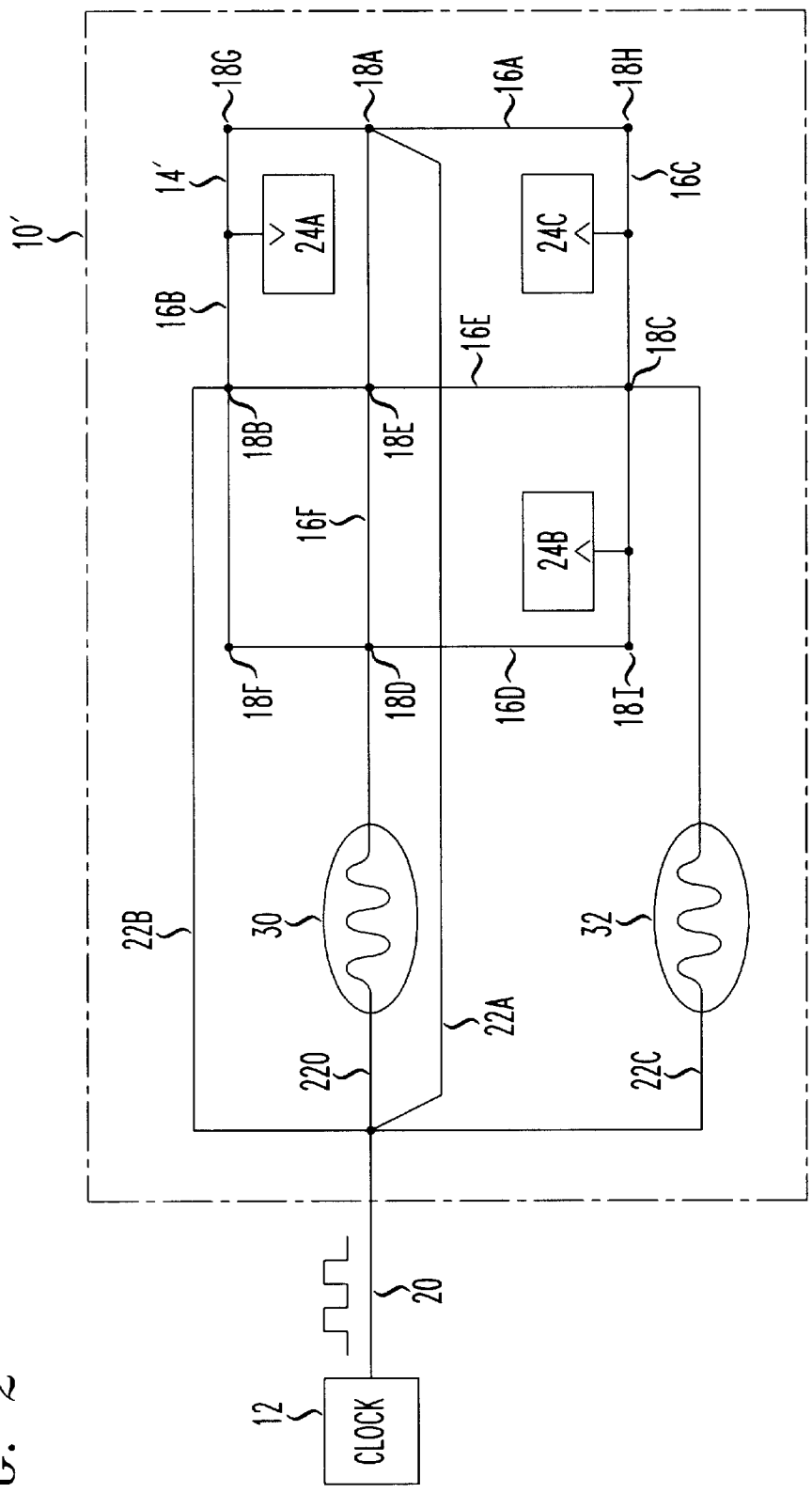
FIG. 2 is a schematic representation of the mesh clock distribution apparatus of FIG. 1 having delivery conductors with redundant sections.

FIG. 2 schematically shows a clock distribution apparatus 10' operably coupled to the clock source 12. The distribution apparatus 10' includes a mesh 14' formed of signal paths 16A, 16B, 16C, 16D, 16E and 16F. The distribution apparatus 10' also includes nodes 18A, 18B, 18C, 18D, 18E, 18F, 18G, 18H and 18I formed at the intersection of two or more of the signal paths. Delivery conductors 22A, 22B, 22C and 22D operably couple the clock source 12 with the selected nodes 18A–18D. However, the delivery conductors do not directly couple the nodes 18E–18I to the clock source 12. The Clocked elements 24A, 24B and 24C are connected to the signal paths. In operation, the clock signal 20 is distributed to the clocked elements 24A–24C via the nodes and the signal paths.

The delivery conductors illustrated in FIG. 2 also include structure for ensuring that the skew between the clock source 12 and the selected nodes in the mesh 14' are substantially equal. For instance, the delivery conductors can include redundant sections that extend the length of the shorter delivery conductors to the length of the longer delivery conductors. In general, the predetermined length of each delivery conductor is based upon the distance between the clock source and a selected node to which the delivery conductor is coupled. In particular, the delivery conductor 22D includes a redundant section 30 and the delivery conductor 22C includes a redundant section 32. The redundant sections 30 and 32 extend their associated delivery conductors to the length of the longer delivery conductors 22A and 22B. As a result, the delivery conductors 22A–22D, with their associated redundant sections, are substantially equal in length and have correspondingly substantially equal time delays between the clock source and the selected nodes 18A–18D.

By minimizing the difference in time delay between the clock source and the selected nodes, error in the synchronous system caused by clock skew is reduced. In general, assuming that all X nodes in the equilateral polygonal mesh are operably coupled to the clock source and that all the delivery conductors with their associated redundant sections are of equal length Y, then one can conclude that:

time delay (clock to 18A)=time delay (clock to 18B)= time delay (clock to 18C)=time delay (clock to 18D)= . .

time delay (clock to node 18X).

Accordingly, the worst case time delay in the clock signal between two arbitrary nodes equals the delay of the clock signal propagating through one edge of the equilateral polygonal mesh. Further, the clock skew for a clocked element is simply a function of the distance from the clocked element to the nearest node, and can thus be controlled and reduced to a greater degree than is available in prior art systems.

In other embodiments according to the invention, additional structure can be employed to further control the skew between the clock source and the selected nodes. For instance, capacitors can be attached to the shorter length delivery conductors to cause these shorter length delivery conductors to have the same capacitance as the longer length delivery conductors. By equating the capacitance in the delivery conductors, the difference in time delay between each of the delivery conductors is reduced. To further reduce the differences in time delay between the delivery conductors, additional resistance or inductance can be added to those delivery conductors that have lesser amounts of resistance or inductance.

Figure 3:
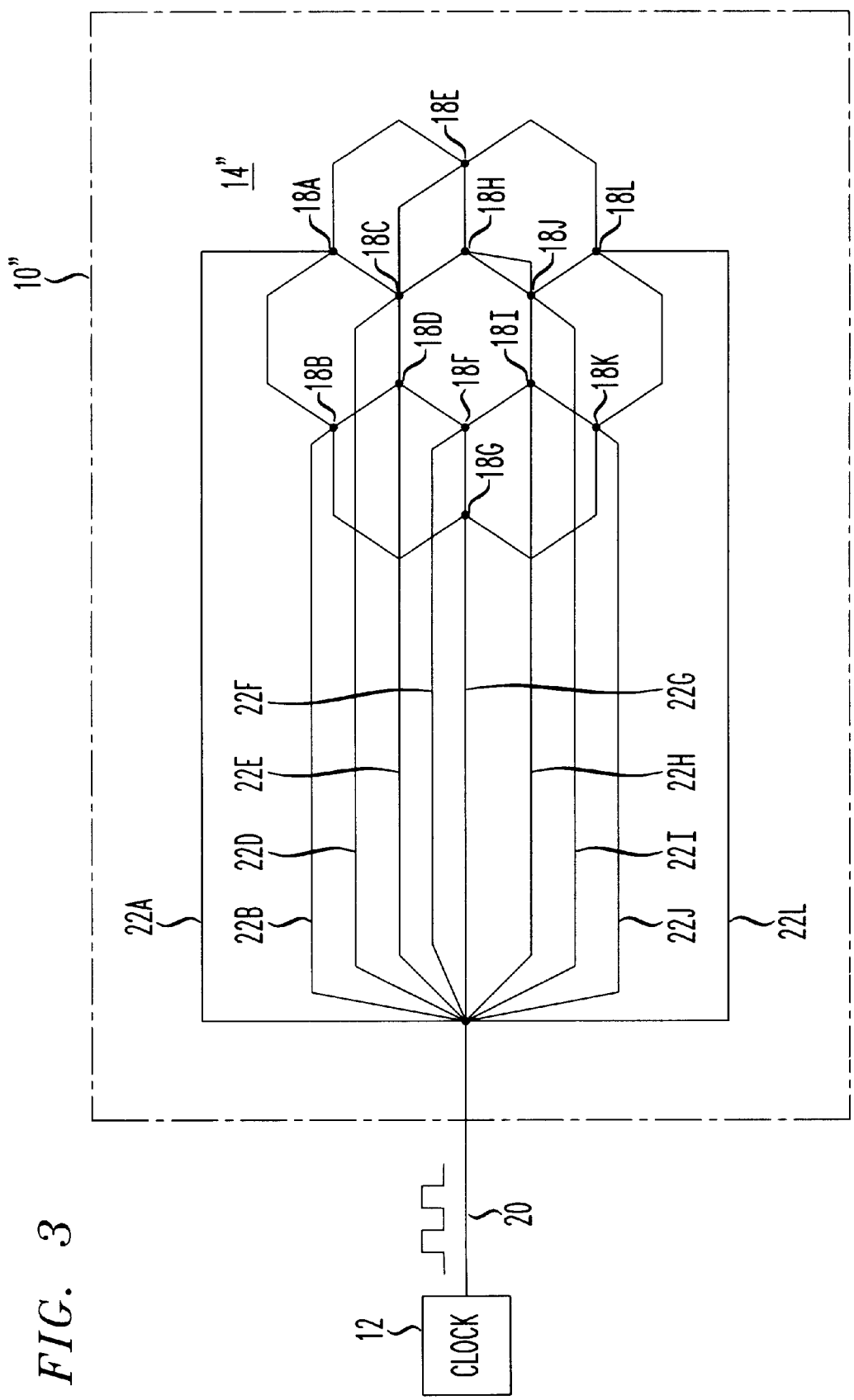
FIG. 3 is a diagram of the mesh clock distribution apparatus of FIG. 1 having a hexagonal mesh.

FIG. 3 schematically shows a clock distribution apparatus 10″ operably coupled to the clock source 12. The distribution apparatus 10″ includes a mesh 14″ including signal paths, and nodes 18A–18L formed at the intersection of two or more of the signal paths. The signal paths form a honeycomb shape of signal paths where each individual cell of the honeycomb is formed of a hexagon. Similar meshes of repeating polygonal shaped signal paths can be formed for any n-sided polygon structure, where n is an integer equal to or greater than 3.

A set of delivery conductors 22A–22L operably couple the clock source 12 with the nodes 18A–18L. A set of clocked elements can be connected to the signal paths. In operation, the clock signal 20 is distributed to the clocked elements via the nodes and the signal paths.

Figure 4:
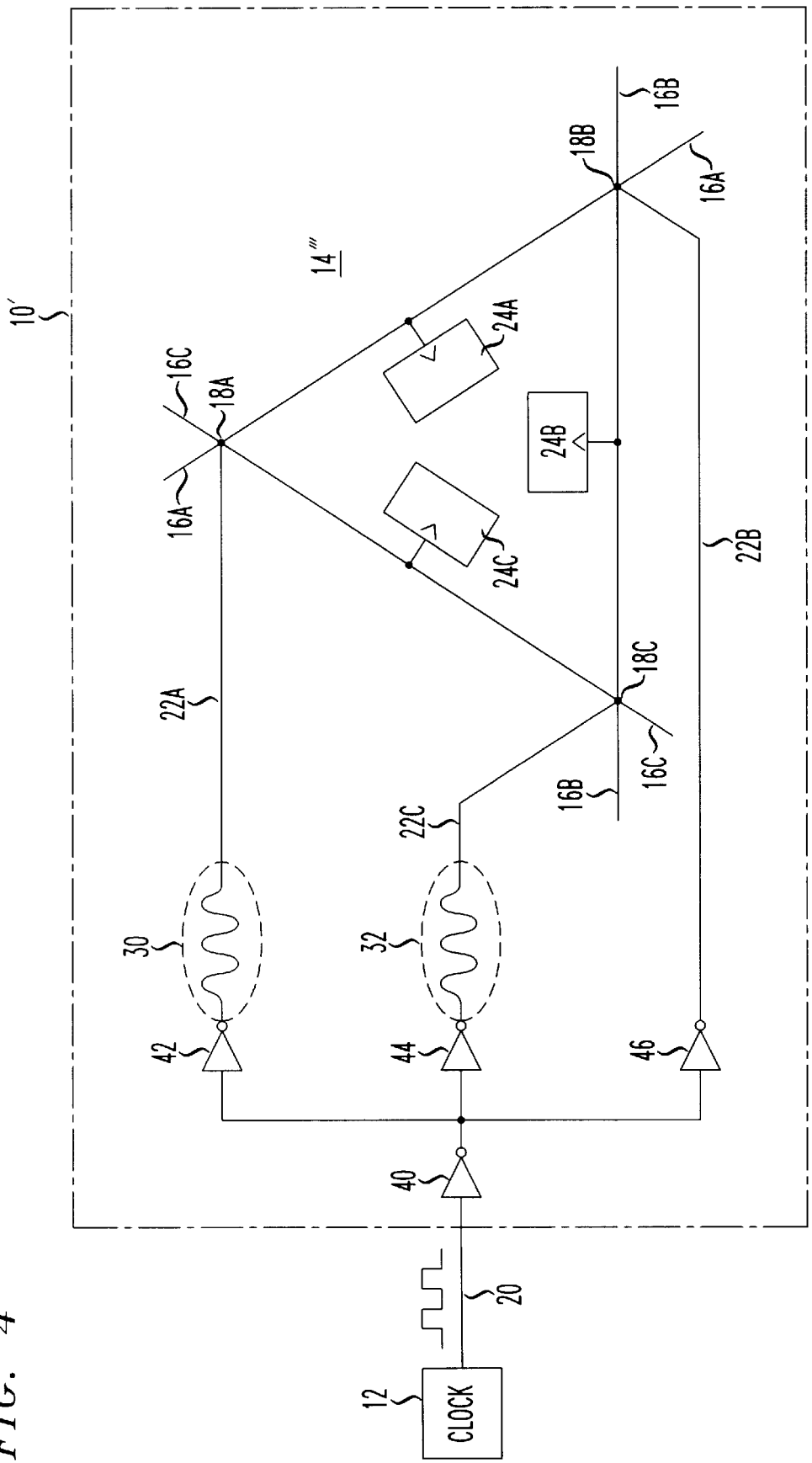
FIG. 4 is a schematic diagram of the mesh of FIG. 2 having buffers coupled between the clock source and the mesh.

FIG. 4 schematically shows a clock distribution apparatus 10‴ operably coupled to the clock source 12. The distribution apparatus 10‴ includes a mesh 14‴ formed of signal paths 16A, 16B and 16C. The distribution apparatus 10‴ also includes nodes 18A, 18B and 18C formed at the intersection of two or more of the signal paths. The signal paths 16A–16C form a closed polygon shape having three sides of equal length, i.e. an isosceles triangle. In addition, the illustrated paths extend beyond the edge of the triangle. A set of delivery conductors 22A, 22B and 22C operably couple the clock source 12 with the nodes 18A–18C. A set of clocked elements 24A, 24B and 24C are connected to the signal paths. In operation, the clock signal 20 is distributed to the clocked elements 24A–24C via the nodes and the signal paths.

The delivery conductors 22A–22C illustrated in FIG. 4 also include structure for ensuring that the skew between the clock source 12 and the selected nodes in the mesh 14‴ are substantially equal. The illustrated delivery conductors 22A and 22C include redundant sections 30 and 32 that extend the length of these delivery conductors to substantially equal to the length of the delivery conductor 22B.

In another aspect of the invention, the clock distribution apparatus 10‴ can include buffers operably coupled between the clock source 12 and the selected nodes for buffering the clock signal. As shown in FIG. 4, a first buffer 40 transmits the clock signal to a set of distribution buffers 42, 44 and 46. The distribution buffers are spliced into the path of each delivery conductor. The buffers 40, 42, 44 and 46 provide the necessary current for driving the clock signal through the mesh 14‴.

Figure 5:
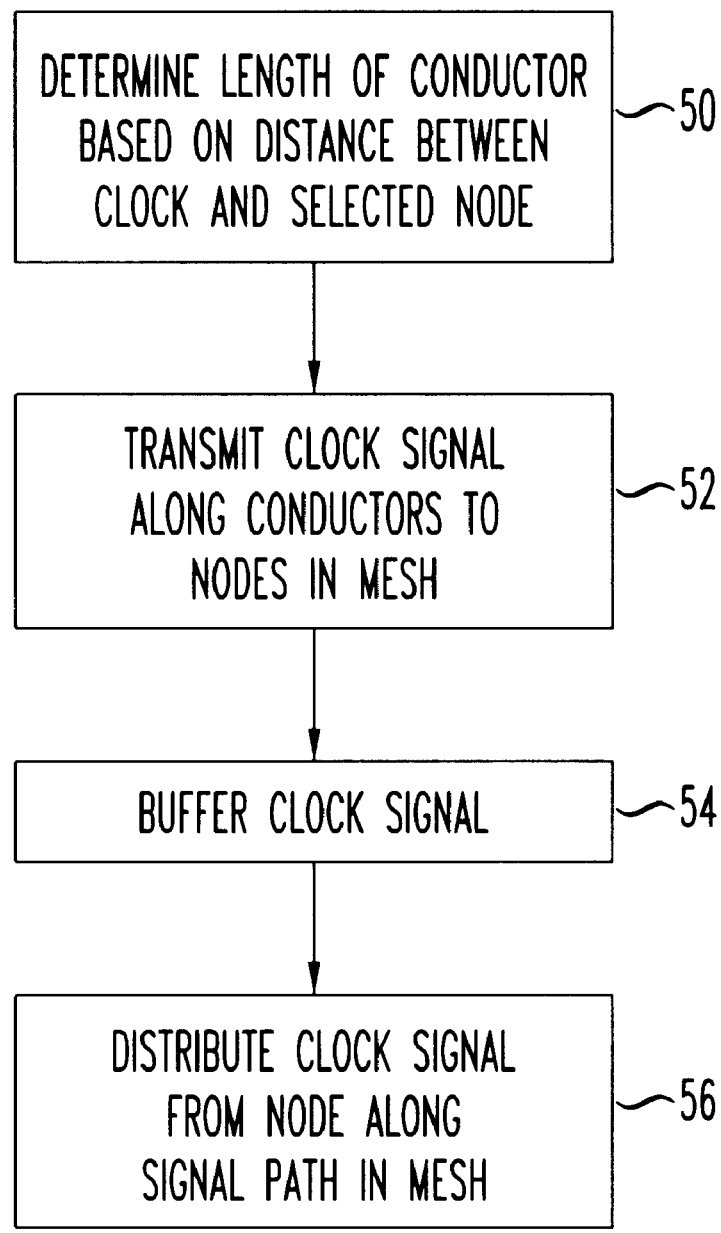
FIG. 5 is a flow chart illustrating steps for distributing the clock signal along the mesh of FIG. 1.
Figure 6:
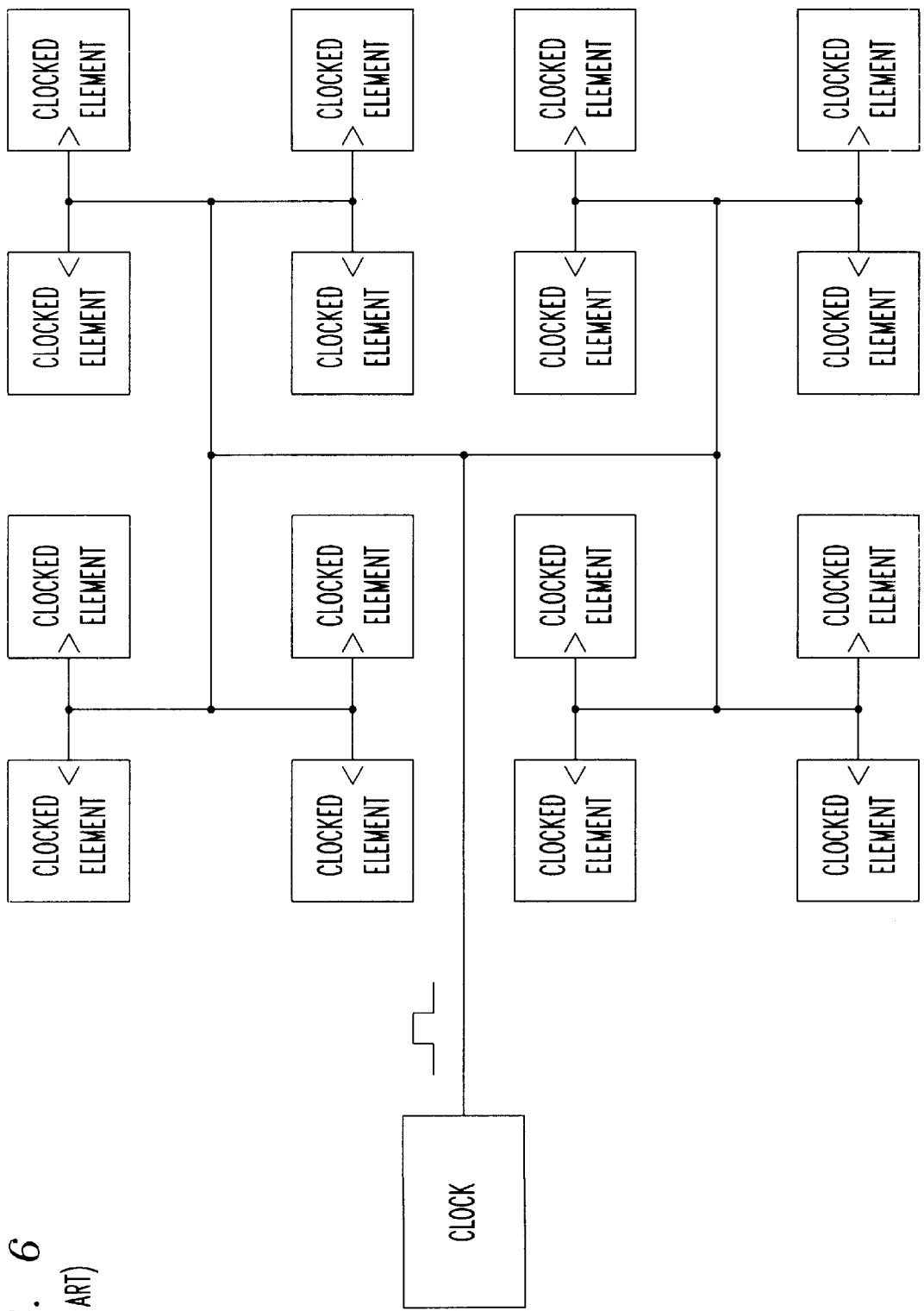
FIG. 6 is a conventional H-tree clock distribution scheme.

FIG. 5 illustrates an exemplary flow chart for distributing the clock signal 20 along the mesh 14 in accordance with the invention. At step 50, the length of the delivery conductors are determined based upon the distance between the clock source 12 and the selected node to which each delivery conductor is connected. At step 52, the clock signal 20 is transmitted along the delivery conductors 22 operably coupled to the nodes, each node being formed at the intersection of at least two signal paths. At step 54, the clock signal is buffered to provide the required current for driving the mesh 14 and the clocked elements 24. At step 56, the clock signal is distributed from the nodes along the signal paths 16, such that the skew between the clock source and each of the selected nodes is substantially equal.

While the invention has been shown and described having reference to specific preferred embodiments, those skilled in the art will recognize that variations in form and detail may be made without departing from the spirit and scope of the invention. Thus, specific details of the disclosure herein are not intended to be necessary limitations on the scope of the invention other than as required by the prior art.

We claim:

1. An apparatus for distributing a clock signal generated at a clock source, the apparatus comprising:

a mesh formed of a plurality of signal paths that interconnect at a plurality of nodes such that at least three of the signal paths form sides of a closed equilateral polygon, each node being formed at the intersection of at least two signal paths and the signal paths acting, to distribute the clock signal applied at the nodes, and a plurality of delivery conductors operably coupling the clock source to selected nodes of the mesh.

2. The apparatus according to claim 1, wherein at least one of the delivery conductors includes a redundant section having a predetermined length, the predetermined length being based upon the distance between the clock source and a selected node to which the at least one delivery conductor is coupled.

3. The apparatus according to claim 2, wherein the predetermined length of the redundant section is inversely related to the distance between the clock source and the selected node, such that each node receives the clock signal at substantially the same time.

4. The apparatus according to claim 2, wherein the delivery conductors are electrical conductors.

5. The apparatus according to claim 4, wherein at least one of the electrical conductors has a predetermined resistance, the predetermined resistance being based upon the distance between the clock source and the node to which the at least one electrical conductor is coupled.

6. The apparatus according to claim 4, wherein at least one of the electrical conductors has a predetermined capacitance, the predetermined capacitance being based upon the distance between the clock source and the node to which the at least one electrical conductor is coupled.

7. The apparatus according to claim 1, wherein the mesh includes three signal paths that form a triangle.

8. The apparatus according to claim 1, wherein the mesh includes four signal paths that form a square.

9. The apparatus according to claim 1, wherein the mesh includes six signal paths that form a hexagon.

10. The apparatus according to claim 1, wherein the signal paths extend beyond the edge of the closed polygon.

11. The apparatus according to claim 1, wherein the mesh is an electrically conductive path in an integrated circuit.

12. The apparatus according to claim 1, wherein the mesh is an electrically conductive path in a printed circuit board.

13. The apparatus according to claim 1, further comprising a buffer operably coupled between the clock source and a selected node for buffering the clock signal.

14. A method for distributing a clock signal generated at a clock source, the method comprising the steps of:

transmitting the clock signal along a plurality of delivery conductors operably coupled to a node in a mesh, the mesh being formed of at least three signal paths forming sides of a closed equilateral polygon and wherein each node is formed at the intersection of at least two signal paths, and distributing the clock signal from the node along the at least two signal paths.

15. The method according to claim 14, further comprising the step of determining the length of a delivery conductor, the determined length being based upon the distance between the clock source and a selected node to which the delivery conductor is coupled.

16. The method according to claim 14, further comprising the step of buffering the clock signal between the clock source and a selected node.

17. An integrated circuit having an array of memory elements and having conductive paths for distributing a clock signal to the array of memory elements, the integrated circuit comprising:

a mesh formed of a plurality of signal paths that interconnect at a plurality of nodes such that at least three of the signal paths form sides of a closed equilateral polygon, each node being formed at the intersection of at least two signal paths and the signal paths acting to distribute the clock signal applied at the nodes to the memory elements, and a plurality of delivery conductors operably coupling a clock source to selected nodes of the mesh.

* * * * *